June 20, 1961 I. I. GRASHEIM ET AL 2,989,706

PULSE GENERATING CIRCUIT COMPRISING CASCADED SHOCK-EXCITED OSCILLATORS

Filed April 11, 1957

INVENTORS
IRVING I. GRASHEIM &
BY STEPHEN V. MORMILE

F. A. Rechif
ATTORNEY

United States Patent Office 2,989,706

Patented June 20, 1961

2,989,706

PULSE GENERATING CIRCUIT COMPRISING CASCADED SHOCK-EXCITED OSCILLATORS

Irving I. Grasheim, Pennsauken, and Stephen V. Mormile, Camden, N.J., assignors to Radio Corporation of America, a corporation of Delaware Filed Apr. 11, 1957, Ser. No. 652,279
2 Claims. (Cl. 331—50)

This invention relates to a pulse generating circuit, and more particularly to an arrangement for generating periodically-recurring short pulses from a stable frequency input wave having the same periodicity.

In communications systems used for single sideband and narrow band Teletype, it is necessary that the heterodyne oscillator employed have extreme frequency stability. In order to provide such extreme frequency stability, there have been devised so-called pulse-locked generator frequency control systems. Such systems commonly employ frequency control loop principles, in which the heterodyne oscillator is controlled or held captive on the desired frequency by means of a reactance tube and a phase detector circuit. Between the heterodyne oscillator and the input of the phase detector, there are one or more mixing stages in each of which a wave representative of the heterodyne oscillator output is mixed with the output of a respective reference oscillator. The latter oscillators are commonly known as pulse-locked oscillators because they, in turn, are made (by means of separate loops) to operate at respective frequencies which are exact harmonics or multiples of the recurrence or repetition frequency of stable, accurate, periodically-recurring pulses.

Frequency control systems of the above-described type are disclosed in the copending Robinson application, Serial No. 584,103, filed May 10, 1956, now Patent No. 2,888,562, and also in the copending Grasheim application, Serial No. 649,748, filed April 1, 1957, now abandoned.

The duration of the pulses used for locking in the pulse-locked oscillators, in a pulse-locked oscillator control system of the type mentioned, must be short relative to one cycle of the alternating voltage to be locked (that is, relative to one cycle of the pulse-locked oscillator output voltage). For example, in the system disclosed in the aforementioned Grasheim application, wherein one of the pulse-locked oscillators is operated up to approximately 34 megacycles (mc.) and is locked in by pulses having a 100-kilocycle (kc.) repetition rate, that is, wherein this one oscillator is made to have an output frequency which is an integral multiple or harmonic of the repetition frequency (100 kc.) of periodically-recurring pulses, pulses having a duration on the order of 0.02 microsecond or less are required. More specifically, it is desired that the pulses recurring at a repetition rate of 100 kc. have a duration on the order of 0.015 microsecond. Pulses of this duration are very sharp or short.

In known prior art systems, a blocking oscillator is used to generate the pulses of 0.0166-microsecond duration which are necessary to lock in a pulse-locked oscillator operating at frequencies up to 30 mc. Such a blocking oscillator is subject to drift, and it is therefore necessary, in such prior art systems, that the blocking oscillator be stabilized (drift compensated) over the extremes of temperature variation and voltage variation expected. Unless this stabilization is very carefully done, the blocking oscillator can pull out of lock (that is, it can pull out of synchronism with the substantially sinusoidal input wave from which the sharp pulses are being developed), or it can jitter, in either of which circumstances phase modulation of the pulse-locked oscillator is produced. This phase modulation can be quite substantial, particularly when it is remembered that a one-degree jitter of the 100-kc. pulses is multiplied 300 times when the pulse-locked oscillator is being locked at 30 mc. Such phase modulation of the pulse locked oscillator is undesirable because it tends to produce proportional phase modulation of the heterodyne, stabilized, or captive oscillator. Also, blocking oscillators such as used in the prior art draw a rather large current from the power supply.

An object of this invention is to provide a novel pulse generator for generating very short duration periodically-recurring pulses from a substantially sinusoidal input wave having the same periodicity.

Another object is to provide a pulse generating circuit which is not subject to frequency drift, and which eliminates the need for frequency drift compensation.

A further object is to provide a novel pulse generator which draws only a relatively small current from the power supply.

The objects of this invention are accomplished, briefly, in the following manner: a resonant circuit, whose resonant frequency is many times greater than the frequency of a sinusoidal input wave, is connected in the anode circuit of a tube which is biased to conduct only during the peaks of such input wave. Current pulses are produced at the anode of this tube, and these pulses shock excite the resonant circuit and produce across it a train of damped oscillations. This train of oscillations is applied to the grid of a second tube biased similarly to the first tube. This second tube also has a resonant circuit connected in its anode circuit. This last-mentioned resonant circuit has a resonant frequency equal to that of the first resonant circuit. The second resonant circiut is similarly shock excited by the train of oscillations which is applied to the grid of the second tube. A unidirectional conducting device (rectifier) is associated with the second resonant circuit for eliminating oscillatory energy of a predetermined polarity from the train of damped oscillations produced across such second circuit. If desired, further shock-excited resonant circuits may be used in order to further shorten or sharpen the pulses produced.

A detailed description of the invention follows, taken in conjunction with the accompanying drawing, wherein.

Figures 1, 2:
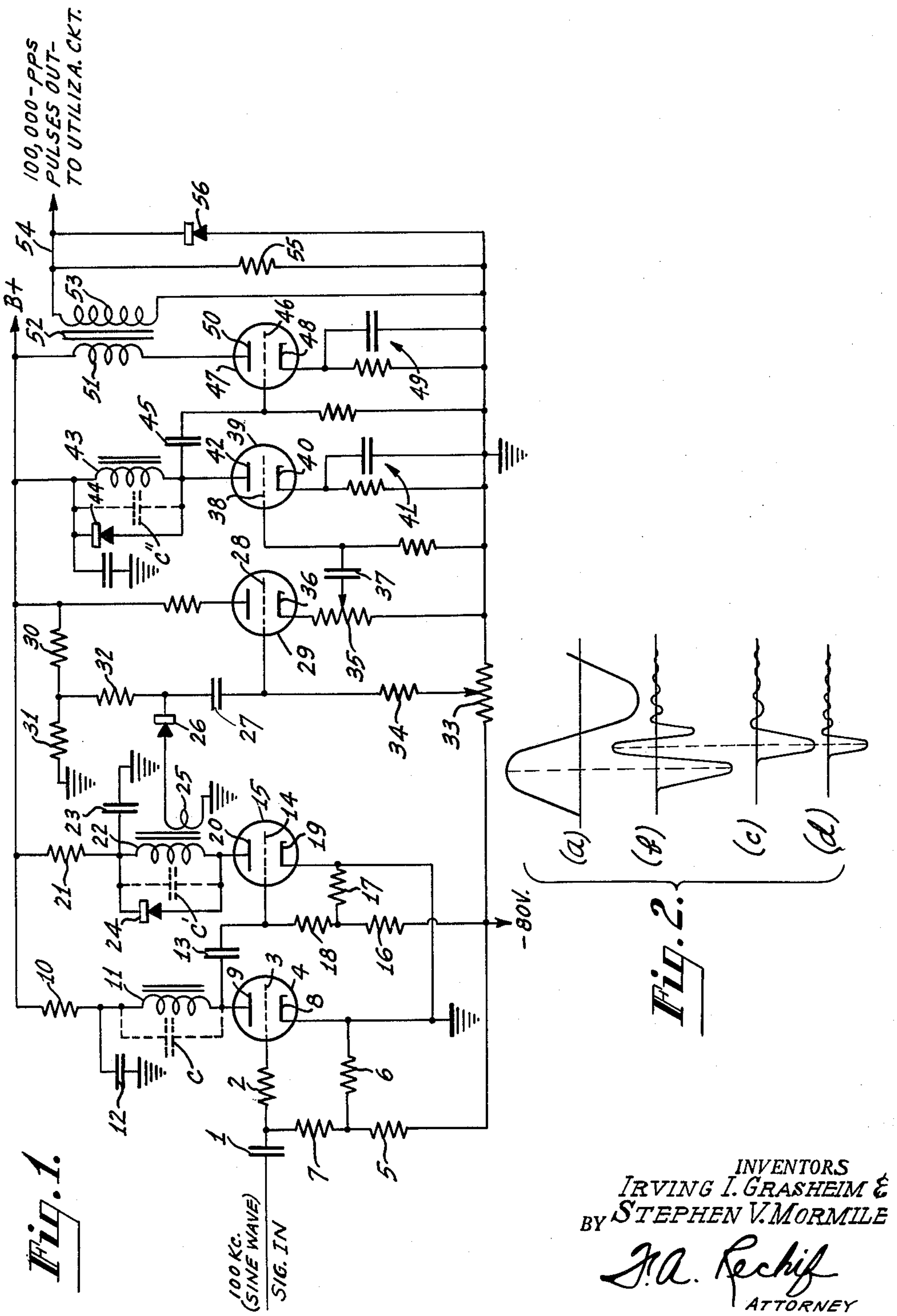
FIG. 1 is a schematic diagram of a circuit embodying the present invention.
FIG. 2 is a set of waveforms representative of the waves occurring at various points in the circuit of FIG. 1.

Referring now to FIG. 1, a substantially sinusoidal input wave, having a frequency of 100 kc. for example, is fed through a coupling capacitor 1 and a resistor 2 to the control grid 3 of a triode electrode structure 4, which may for example be one-half of a type 5687 vacuum tube. The input wave so applied to grid 3 is obtained from a suitable source of very accurate and stable frequency. For example, the 100-kc. sine wave input may be obtained from a "frequency standard" unit including a crystal-stabilized oscillator operating for example at one megacycle, the output of this oscillator being fed through a frequency divider to derive the 100-kc. sinsusoidal input signal for the pulse generator of this invention. This sinusoidal input signal is represented by the wave form in FIG. 2(*a*).

Tube 4 is biased negatively in such a manner that it will coduct only during the positive peaks of the FIG. 2(*a*) input wave applied to grid 3. In order to effect such biasing, a pair of resistors 5 and 6 are connected in series between a source of negative potential (−80 volts) and ground in such a way as to provide a voltage divider, and from the junction point of resistors 5 and 6 a connection extends through resistors 7 and 2 to control grid 3. Thus, a potential which is negative with respect to ground is applied to grid 3. The cathode 8 of tube 4 is connected directly to ground, so that grid 3 is biased negatively with respect to cathode 8. This negative bias is sufficient so that tube 4 does not conduct except during the positive peaks of the 100-kc. sinusoidal input wave applied to grid 3.

In order to supply positive polarizing potential to anode 9 of triode structure 4, a connection extends from the positive terminal B+ of a source of unidirectional potential through a resistor 10 and an inductor 11 to anode 9. A bypass capacitor 12 is connected from the junction of components 10 and 11 to ground. The inductor 11 is thus connected directly to anode 9. Inductor 11 is so constructed and arranged that, with its distributed capacitance C, a resonant circuit is provided which has a resonant frequency many times greater than the 100-kc. frequency of the input wave applied to grid 3.

The sine wave applied to grid 3 has an amplitude sufficient to drive tube 4 into conduction at or near the positive peaks of such wave. Each time this tube conducts, a current pulse is produced at anode 9. Thus, a series of current pulses appears at anode 9, there being one such current pulse for each cycle of the sine wave input applied to grid 3. Tube 4 is pulsed on 100,000 times per second, that is, at a rate of 100-kc., by the 100-kc. wave applied to grid 3. Each of the current pulses so produced at anode 9 shock excites the resonant circuit 11, C, thereby producing a train of damped oscillations across such resonant circuit in response to each of the current pulses produced at anode 9. The damped oscillations produced across inductor 11 have a frequency corresponding to the resonant frequency of the resonant circuit 11, C, and since this latter resonant frequency is many times greater than the frequency of the input wave (100 kc.), the time duration of one cycle of the oscillations appearing across inductor 11 is much less than the time duration of one cycle of the input wave applied to grid 3.

When tube 4 begins to conduct, the initial surge of anode current charges the distributed capacitance C of the inductor 11. The current then drops back to a low value and increases at the rate that current can build up through the inductor. A voltage of negative polarity (relative to the unidirectional anode potential) is developed across the resonant circuit 11, C, since such voltage must oppose the rise of current through the inductor 11 and since the electron current flows toward the anode supply B+. Thus, the initial voltage swing developed across inductor 11 is negative.

The resonant circuit 11, C has a high Q, so that the circuit losses are low, there is a minimum of damping, and a train of damped oscillations, having a frequency equal to the resonant frequency of circuit 11, C, is developed across inductor 11 in response to each of the periodically-occurring current pulses produced at anode 9. This train of damped oscillations terminates before the appearance of the next current pulse produced at anode 9. These current pulses, as previously stated, occur when tube 4 is caused to conduct at or near each positive peak of the 100-kc. input wave applied to grid 3.

Each train of damped oscillations thus produced across inductor 11 (one such train being produced in response to each current pulse appearing at anode 9) includes both positive and negative half cycles with respect to a zero axis determined by the positive anode potential B+. One such train is represented by the waveform in FIG. 2(*b*). Although, as previously stated, the initial voltage swing is negative, it is followed by a positive voltage swing, due to the "ringing" across inductor 11, which forms part of a high-Q circuit.

The alternating current component of this damped train of oscillations is coupled by means of a capacitor 13 to the control grid 14 of a triode electrode structure 15 which may, for example, be in a common evacuated envelope with the triode structure 4. Structure or tube 15, like structure 4, is biased to conduct only during the positive peaks of an input wave applied thereto. To provide the proper negative bias on grid 14, a voltage divider including two series-connected resistors 16 and 17 is connected between a source of negative potential (−80 volts, for example) and ground. Grid 14 is connected by way of a resistor 18 to the junction of resistors 16 and 17. In this way, a negative voltage is applied to grid 14, while the cathode 19 of tube 15 is grounded.

The initial negative voltage swing of the train of damped oscillations appearing across inductor 11 is followed by a positive voltage swing, as stated. The positive voltage swing is of sufficient amplitude to cause tube 15 to conduct, thereby producing a pulse of current at anode 20 of tube 15.

In order to supply positive polarizing potential to anode 20 of triode structure 15, a connection extends from the positive terminal B+ of the source of unidirectional potential through a resistor 21 and an inductor 22 to anode 20. A bypass capacitor 23 is connected from the junction of components 21 and 22 to ground. The inductor 22 is thus connected directly to anode 20. Inductor 22 is so constructed and arranged that, with its distributed capacitance C′, a resonant circuit is provided which has a resonant frequency equal to that of the resonant circuit 11, C, or in other words, a resonant frequency many times greater than the 100-kc. frequency of the sinusoidal input wave applied to grid 3.

As previously described, the trains of damped oscillations produced across inductor 11 are applied through capacitor 13 to grid 14, and the first positive voltage swing of each train of damped oscillations is of sufficient amplitude to drive tube 15 into conduction. Each time tube 15 conducts, a current pulse is produced at anode 20. Thus, a series of current pulses appears at anode 20, there being at least one such current pulse for each train of damped oscillations appearing across inductor 11 and applied to grid 14. Each of the current pulses so produced at anode 20 shock excites the resonant circuit 22, C′, thereby producing a (second) train of damped oscillations across such resonant circuit in response to each of such current pulses. The damped oscillations produced across inductor 22 have a frequency corresponding to the resonant frequency of the resonant circuit 22, C′, and since this latter resonant frequency is many times greater than the frequency of the input wave (100 kc.), the time duration of one cycle of the oscillations appearing across inductor 22 is much less than the time duration of one cycle of the input wave applied to grid 3.

Each train of damped oscillations produced across inductor 22 (one such train being produced in responce to each current pulse appearing at anode 20) includes both positive and negative half cycles with respect to a zero axis determined by the positive anode potential B+. One such train is represented by the waveform in FIG. 2(*c*).

A unilateral conducting device (rectifier) 24 is connected in shunt with the resonant circuit 22, C′. Diode rectifier 24 provides a low resistance across the resonant circuit 22, C′ for oscillatory energy of a predetermined polarity, which polarity is positive. In this way, the rectifier 24 loads the shock-excited or ringing circuit 22, C′ for energy of this predetermined polarity. The diode 24 loads the ringing circuit 22, C′, thereby damping the positive portions of the train of oscillations appearing across inductor 22 or cutting off the positive ringing of the wave train appearing across inductor 22. Thus, the resonant circuit 22, C′ is caused to have a low Q for oscillatory energy of a predetermined (positive) polarity.

For abstracting output from the second resonant circuit 22, C′, an output connection comprising a winding 25 is inductively coupled to inductor 22. One end of winding 25 is grounded, while the opposite end is connected through a biased diode rectifier 26 and a coupling capacitor 27 to the grid 28 of a triode electrode structure 29. Winding 25 is so poled as to develop a positive voltage at its ungrounded end in response to a negative voltage swing across inductor 22. Structure 29 may, for example, be one-half of a type 5687 vacuum tube, and is connected to operate as a cathode follower stage. Diode 26 is biased so as to pass only high-amplitude signal pulses. Since this latter diode is connected in series with the output winding 25, only signals above a predetermined amplitude can pass through this diode. Thus, the combination of diodes 24 and 26 acts to pass to the cathode follower output stage 29 only a single high-amplitude, sharp pulse of a predetermined (positive) polarity, effectively preventing other portions of the damped oscillatory wave train appearing across inductor 22 from getting to the output cathode follower stage 29.

In order to provide the desired limiting out of low-amplitude signals, thereby causing only a single high-amplitude pulse to be transferred to the cathode follower stage 29, a positive bias is applied to the cathode of the series diode 26. In order to accomplish this, a voltage divider comprising two series-connected resistors 30 and 31 is connected from the positive unidirectional voltage terminal B+ to ground, and the cathode of diode 26 is connected through a resistor 32 to the common junction of resistors 30 and 31.

In order to provide a negative operating bias on grid 28 of triode 29, a potentiometer 33 has one end connected to the negative terminal (—80 volts) and its opposite end connected to ground. The movable tap on potentiometer 33 is connected through a resistor 34 to control grid 28, while a potentiometric resistance 35 is connected from the cathode 36 of structure 29 to ground.

As previously described, a series of single sharp positive pulses, one occurring during each cycle of the 100-kc. input applied to grid 3, is passed by diode 26 and applied to grid 28 of cathode follower stage 29. This series of pulses occurs periodically, at a rate determined by the input wave applied to grid 3. This rate is 100,000 pulses per second, since the input wave applied to grid 3 has a frequency of 100 kc.

The series of pulses applied to grid 28 appears across potentiometric resistance 35 in the cathode circuit of cathode follower stage 29. Each pulse which appears in the output of this cathode follower stage is a sharp pulse, with approximately 0.04-microsecond rise time and a duration of 0.1 microsecond. In order to further sharpen or reduce the duration of these pulses, a certain portion of the pulse voltage is abstracted from resistor 35 by means of the movable tap thereon, and is applied through a coupling capacitor 37 to the control grid 38 of a triode structure 39 connected to operate as a pulse shaper. Structure 39 may, for example, be one-half of a type 5687 vacuum tube. Cathode 40 of structure 39 is connected to ground through a self-biasing resistance-capacitance network 41.

Connected to the anode 42 of triode 39 is an inductor 43 which, with its distributed capacitance C″, forms a resonant circuit whose resonant frequency is many times greater than the frequency of the 100-kc. input signal applied to grid 3. Anode 42 is connected through the inductor 43 to the positive terminal B+ of the unidirectional potential source.

Each of the pulses applied through capacitor 37 to grid 38 serves to shock excite the resonant circuit including inductor 43, in substantially the same manner as previously described in connection with inductor 22. Thus, a train of damped oscillations is produced across inductor 43 in response to each of the pulses applied to grid 38. One such train is represented by the waveform in FIG. 2(*d*).

A diode rectifier 44 is connected across inductor 43. Rectifier 44 has a function similar to that of rectifier 24, previously described, that is, to shunt away from the output circuit of pulse shaper 39, oscillatory energy of a predetermined (positive) polarity, as well as to load the ringing circuit which includes inductor 43, for energy of this particular polarity.

The signal appearing across inductor 43 (that is, the series of trains of damped oscillations as modified by the action of diode 44) is coupled by way of a coupling capacitor 45 to the grid 46 of a triode electrode structure 47 connected to operate as an amplifier. Triode structure 47 may be the second half of a type 5687 vacuum tube, the first half being the triode structure 39. The cathode 48 of triode 47 is connected to ground through a self-biasing resistance-capacitance network 49. The anode structure 47 is connected to the positive terminal B+ of the unidirectional potential source by way of the primary winding 51 of an output (pulse) transformer 52. One end of the secondary winding 53 of transformer 52 is grounded, while the opposite end is connected to an output lead 54. In order to provide further elimination of undesired portions of the wave appearing across inductor 43, a resistor 55 is connected between lead 54 and ground, and also a diode rectifier 56 is connected between lead 54 and ground.

The action of the resonant circuit including inductor 43 is such as to further shorten, sharpen, or reduce the time duration of, the pulses applied to grid 38. This shortening or sharpening of the pulses again results from the shock excitation of the resonant circuit (including inductor 43) by the pulses appearing across resistor 35 and applied to grid 38. The diodes 44 and 56 serve to limit the signal appearing on lead 54 to a series of single high-amplitude pulses of predetermined polarity. These pulses have a repetition rate of 100,000 pulses per second (as determined by the 100-kc. sinusoidal input signal applied to grid 3), and a time duration of approximately 0.015 microsecond.

The pulses appearing on lead 54, which have a repetition rate of 100,000 pulses per second and are of very short duration, are applied to a suitable utilization circuit. These pulses may, for example, be used to lock in a pulse-locked oscillator, by means of a control loop as disclosed in the aforementioned Grasheim application. Such a pulse-locked oscillator may, for example, operate over a frequency range of 3.9 to 33.8 mc.

In the circuit of this invention, there are no elements which are at all critical as to frequency, that is, there are no elements whose drift could effect the repetition frequency of the pulses at the output. In the circuit of this invention, the pulses are generated from a stable frequency source, and are not determined as to repetition or recurrence frequency by any critical characteristics of the inductors 11, 22, or 43. Therefore, no stabilization is needed in the pulse generating circuit of the invention. Also, there are no components in the circuit of this invention which draw a large current, such as is drawn by the blocking oscillator used in known prior art systems.

What is claimed is:

1. Apparatus for producing very short duration periodically recurring pulses from a sinusoidal input wave having the same periodicity comprising means for producing a single pulse of a given polarity for each cycle of said sinusoidal input wave, an electron discharge device having a cathode, an anode and a control electrode, means for providing a current supply for said electron discharge device, a resonant circuit connected between said anode and said current supply, said resonant circuit having a resonant frequency greater than the frequency of said sinusoidal input wave, means for applying said single pulses to said control electrode to shock excite said resonant circuit, a second electron discharge device having a cathode, an anode and a control electrode, a second resonant circuit connected between said anode of said second electron discharge device and said current supply, and coupling means for applying the output of said first named circuit to said control electrode of said second electron discharge device, said coupling means comprising an inductor coupled to said first named resonant circuit, one end of said inductor being connected to a point of reference potential for said apparatus, a unilaterally conducting device having an anode and a cathode, a connection from said anode of said unilaterally conducting device to the remaining end of said inductor, means coupling said cathode of said unilaterally conducting device to said control electrode of said second electron discharge device and means for biasing said cathode of said unilaterally conducting device positive with respect to said circuit reference point.

2. Apparatus for producing very short duration periodically recurring pulses from a sinusoidal input wave having the same periodicity comprising means for producing a single pulse of positive polarity for each cycle of said sinusoidal input wave, an electron discharge device having a cathode, an anode and a control electrode, means for providing a current supply for said electron discharge device, a resonant circuit connected between said anode and said current supply, said resonant circuit having a resonant frequency greater than the frequency of said sinusoidal input wave, a unilaterally conducting device connected in shunt with said resonant circuit to provide a low resistance to oscillatory energy of positive polarity, means for applying said single pulses to said control electrode to shock excite said resonant circuit, a second electron discharge device having a cathode, an anode and a control electrode, a second resonant circuit connected between said anode of said second electron discharge device and said current supply, and coupling means for applying the output of said first named resonant circuit to said control electrode of said second electron discharge device, said coupling means comprising an inductor coupled to said first named resonant circuit whereby to provide a positive going pulse upon occurence of a negative going pulse in said first named resonant circuit, one end of said inductor being connected to a point of reference potential for said apparatus, a unilaterally conducting device having an anode and a cathode, a connection from said anode of said unilaterally conducting device to the remaining end of said inductor, means coupling said cathode of said second named unilaterally conducting device to said control electrode of said second electron discharge device and means for biasing said cathode of said second named unilaterally conducting device positive with respect to said circuit reference point.

References Cited in the file of this patent

UNITED STATES PATENTS

| | | |
|---|---|---|
| 2,418,375 | Tourshou | Apr. 1, 1947 |
| 2,434,920 | Grieg | Jan. 27, 1948 |
| 2,438,904 | De Rosa | Apr. 6, 1948 |
| 2,449,848 | Hefele | Sept. 21, 1948 |
| 2,484,763 | Sturm | Oct. 11, 1949 |
| 2,499,234 | Tourshou | Feb. 28, 1950 |
| 2,502,343 | Reber | Mar. 28, 1950 |
| 2,768,299 | Boff | Oct. 23, 1956 |

FOREIGN PATENTS

| | | |
|---|---|---|
| 625,983 | Great Britain | July 7, 1949 |